United States Patent
Cheng et al.

(10) Patent No.: US 9,880,596 B2
(45) Date of Patent: Jan. 30, 2018

(54) POWER MANAGEMENT MECHANISM

(75) Inventors: Hank Cheng, Taichung (TW); Bharath Upputuri, Santa Clara, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1485 days.

(21) Appl. No.: 13/536,819

(22) Filed: Jun. 28, 2012

(65) Prior Publication Data

US 2012/0274135 A1 Nov. 1, 2012

Related U.S. Application Data

(63) Continuation of application No. 12/706,849, filed on Feb. 17, 2010, now Pat. No. 8,219,843.

(51) Int. Cl.

| G11B 17/028 | (2006.01) |
|---|---|
| G06F 1/26 | (2006.01) |
| G06F 1/28 | (2006.01) |
| H02M 3/335 | (2006.01) |
| G11C 7/12 | (2006.01) |

(52) U.S. Cl.
CPC ............... *G06F 1/26* (2013.01); *G06F 1/28* (2013.01); *G11C 7/12* (2013.01); *H02M 3/335* (2013.01); *Y10T 307/406* (2015.04)

(58) Field of Classification Search
CPC . G06F 1/26; G06F 1/3203; G06F 1/30; G06F 1/24; G06F 1/305; G09G 5/00
USPC ...... 713/330, 320, 300, 322; 307/80, 82, 43, 307/66, 64; 361/21, 45, 48
See application file for complete search history.

(56) References Cited

U.S. PATENT DOCUMENTS

| 6,246,259 B1 * | 6/2001 | Zaliznyak ...... H03K 19/018592 |
| | | 326/41 |
| 6,275,425 B1 * | 8/2001 | Eliason ................. G11C 5/145 |
| | | 327/530 |
| 6,329,857 B1 * | 12/2001 | Fletcher .................. G06F 7/506 |
| | | 327/215 |
| 7,770,037 B2 | 8/2010 | Searles et al. |
| 7,895,458 B2 | 2/2011 | Kim |
| 8,020,017 B2 * | 9/2011 | Padhye ................. G06F 1/3203 |
| | | 713/300 |
| 8,198,751 B2 * | 6/2012 | Katou ................... G06F 1/3203 |
| | | 307/140 |
| 8,219,843 B2 * | 7/2012 | Cheng ....................... G06F 1/26 |
| | | 307/31 |
| 2004/0239661 A1 * | 12/2004 | Jo ......................... G09G 3/3241 |
| | | 345/204 |

(Continued)

*Primary Examiner* — Rexford Barnie
*Assistant Examiner* — Jagdeep Dhillon
(74) *Attorney, Agent, or Firm* — Hauptman Ham, LLP (57) ABSTRACT

An integrated circuit includes a global power supply node. A first power domain has a first power management circuit, which includes a local power supply node. A first power control circuit is capable of receiving an input signal. A second power control circuit has a higher current capacity than the first power control circuit. The first power control circuit and the second power control circuit are coupled to the local power supply node and the global power supply node. The input signal is configured to initiate a power sequence, e.g., a power up process or a power down process, in the first power control circuit. A first control signal generated by the first power control circuit is configured to initiate a power sequence in the second power control circuit.

20 Claims, 6 Drawing Sheets

(56) References Cited

U.S. PATENT DOCUMENTS

| | | | |
|---|---|---|---|
| 2005/0206441 A1* | 9/2005 | Kimura | H02M 3/073 327/536 |
| 2005/0282505 A1* | 12/2005 | Umeda | G06K 19/0723 455/100 |
| 2006/0184808 A1* | 8/2006 | Chua-Eoan | G06F 1/3203 713/300 |
| 2007/0070659 A1* | 3/2007 | Sawtell | H02M 3/33523 363/21.01 |
| 2008/0136459 A1* | 6/2008 | Ha | G11C 29/02 327/52 |
| 2008/0238541 A1* | 10/2008 | Fasoli | G11C 7/02 330/124 R |
| 2009/0189647 A1* | 7/2009 | Easwaran | G05F 3/262 327/77 |
| 2009/0256541 A1* | 10/2009 | Akyildiz | G06F 1/26 323/283 |
| 2010/0235714 A1* | 9/2010 | Toda | G06F 11/106 714/763 |

* cited by examiner

POWER MANAGEMENT MECHANISM

CROSS-REFERENCE TO RELATED APPLICATION

The present application is a Continuation of and claims the priority of U.S. application Ser. No. 12/706,849, filed Feb. 17, 2010, which is incorporated herein by reference in its entirety.

TECHNICAL FIELD

The present disclosure relates generally to an integrated circuit, more particularly to a power management in the integrated circuit.

BACKGROUND

In a system on chip (SOC) application, the system dynamically powers down unused sections and powers up those sections when they are accessed. In some circuit designs, when a section is not active (e.g., powered down), a header or a footer circuit is used to cut off the leakage paths from a high voltage power supply VDD or a low voltage power supply VSS, respectively.

A conventional header circuit turns on the power directly. If the chip is relatively big, the current required to turn on a large portion of the chip may lower down the power supply voltage level and cause problems. For example, other logic sections in operation may functionally crash and an analog block's accuracy may be affected due to the lower voltage level.

In another example, a high peak turn-on current may induce an electromigration (EM), which is the transport of material caused by the gradual movement of the ions in a conductor due to the momentum transfer between conducting electrons and diffusing metal atoms, potentially causing unsound structure due to undesirable material loss.

Accordingly, new mechanisms are desired to solve the above problems.

BRIEF DESCRIPTION OF THE DRAWINGS

Reference is now made to the following descriptions taken in conjunction with the accompanying drawings, in which.

DETAILED DESCRIPTION

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

Figure 1:
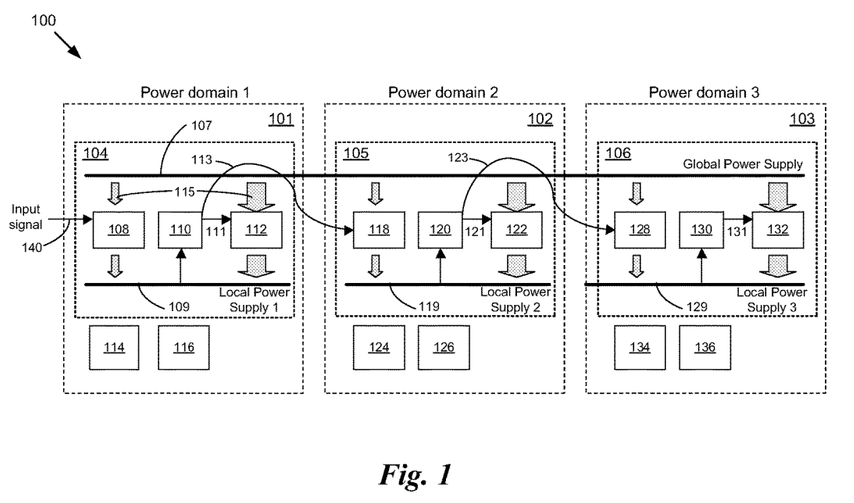
FIG. 1 is a schematic diagram showing an exemplary power management scheme of an integrated circuit with multiple power domains in accordance with some embodiments.

FIG. 1 is a schematic diagram showing an exemplary power management scheme of an integrated circuit with multiple power domains. An integrated circuit 100 has more than one power domain, but for illustration purpose, only three power domains 101, 102, and 103 are shown. Each power domain 101, 102, and 103 has a respective power management circuit, e.g., 104, 105, or 106. Also, each power domain has circuits that need power, for example, a logic circuit, e.g., 114, 124, or 134; and an analog circuit, e.g., 116, 126, or 136 and therefore are subject to the disclosed power sequence. Each power management circuit 104, 105, or 106 has a first power control circuit, e.g., 108, 118, or 128; a sequence circuit, e.g., 110, 120, or 130; and a second power control circuit, e.g., 112, 122, or 132, configured to receive a first control signal, e.g., 111, 121, or 131. Further, both power management circuits 104 and 105 are configured to provide a second control signal, e.g., 113 and 123, respectively. The integrated circuit 100 has a global power supply 107 that supplies power to the power domains 101, 102, and 103. Each power domain has a local power supply, e.g., 109, 119, and 129.

A power sequence, e.g., a power up or a power down process is controlled by the input signal 140. For example, as the input signal 140 initiates a power up process, it serially powers up the first power domain 101, the second power domain 102, and the third power domain 103. Likewise, as the input signal 140 initiates a power down process, it serially powers down the first power domain 101, the second power domain 102, and the third power domain 103. Examples and more details of power up and power down processes are explained below.

An input signal 140 to a first power control circuit 108 in the first power domain 101 controls a power sequence, e.g., a power up process or a power down process, for the power domains 101, 102, and 103. For example, as the input signal 140 enables a power up process for the power domains 101, 102, and 103, a first power control circuit 108 with a limited current capacity (e.g., to limit the peak current through the first power control circuit 108) in the first power domain 101 begins charging up the local power supply 109 of the first power domain 101 from the global power supply 107. In one example, the current capacity of the first power control circuit 108 is not higher than an active current of the first power domain 101. The active current is the current that the first power domain 101 uses for normal operation after powered on.

The first power control circuit 108 charges up the local power supply 109 to a specified voltage level, which is received by a sequence circuit 110. In some embodiments, the specified voltage level can be given as a range instead of one value. After the local power supply 109 reaches the specified voltage level, the sequence circuit 110 provides a first control signal 111 to enable a second power control circuit 112 of the first power domain 101. Then the second power control circuit 112 begins charging up the local power supply 109 from the global power supply 107 with a higher current capacity than the first power control circuit 108. Arrows 115 shows that the second power control circuit 112 has a higher current capacity than the first power control circuit 108. In one example, the current capacity of the second power control circuit 112 is sufficient enough so that the local power supply 109 can maintain at least 95% of the nominal power supply voltage when the first power domain 101 is active.

The specified voltage level where the first control signal 111 enables the second power control circuit 112 is provided so that when the second power control circuit 112 begins charging up, the voltage difference between the global power supply 107 and the local power supply 109 is less than the maximum voltage difference possible, e.g., VDD to ground. For example, if the specified voltage level is 1.5 V and VDD is 5 V, then the difference is 3.5 V instead of 5 V. By starting the second power control circuit 112 charging up with less than the maximum voltage difference between the global power supply 107 and the local power supply 109, an excessive peak current from the global power supply 107 is avoided.

Also, the sequence circuit 110 provides a second control signal 113 that is coupled to a first power control circuit 118 of the second power domain 102 to initiate the power up process of the second power domain 102, which is similar to that of the first power domain 101. For the second power domain 102, the second control signal 113 from the first power domain 101 initiates the power up process for the second power domain 102. As the first power control circuit 118 of the second power domain 102 charges up the local power supply 119 of the second power domain 102 to a specified voltage level, a sequence circuit 120 provides a first control signal 121 to a second power control circuit 122 of the second power domain 102 and a second control signal 123 to a first control circuit 128 of the third power domain 103.

Similarly, the second control signal 123 from the second power domain 102 initiates the power up process for the third power domain 103. As the first power control circuit 128 of the third power domain 103 charges up the local power supply 129 of the third power domain 103 to a specified voltage level, a sequence circuit 130 provides a first control signal 131 to a second power control circuit 132 in the third power domain 103. In this example, there is no more power domain to be powered up in the serial chain of power domains 101, 102, and 103 in response to the input signal 140. If there are additional power domains in the chain for the power sequence, a second control signal (not shown) can be provided by the third power domain 103 to initiate the power up process for the next power domain, e.g. a fourth power domain, etc. In other/some embodiments, the number of power domains in the integrated circuit 100 can be any number equal to or greater than 1.

A power down process can be similarly controlled by the input signal 140. As the input signal 140 initiates a power down process, it serially powers down the first power domain 101, the second power domain 102, and the third power domain 103. Examples and more details of power up and power down processes are explained below.

Figure 2:
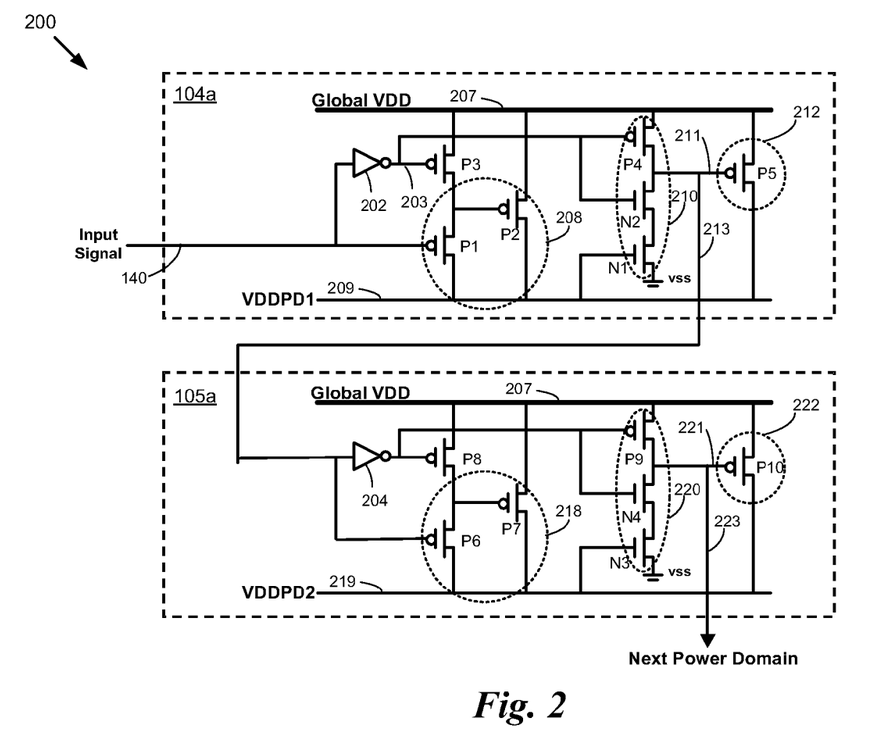
FIG. 2 is a schematic diagram showing an exemplary power management circuit according to FIG. 1 in an integrated circuit with multiple power domains in accordance with some embodiments.

FIG. 2 is a schematic diagram showing an exemplary power management circuit according to FIG. 1 in an integrated circuit with multiple power domains, in accordance with some embodiments. FIG. 2 shows power management circuits 104a for the first power domain 101 (as the power management circuits 104 shown in FIG. 1) and 105a for the second power domain 102 (as the power management circuits 105 shown in FIG. 1). Power management circuits 104a and 105a are implemented as "header" circuits because they are connected to a high power supply voltage VDD. The power management circuit 105a in the second power domain 102 has an equivalent structure, i.e., similar circuit structure and/or similar functionality, as the power management circuit 104a in the first power domain 101. The first power control circuits 208 and 218 correspond to 108 and 118 shown in FIG. 1. The sequence circuits 210 and 220 correspond to 110 and 120 shown in FIG. 1. The second power control circuits 212 and 222 correspond to 112 and 122 shown in FIG. 1. The first control signals 211 and 221 correspond to 111 and 121 shown in FIG. 1. The second control signals 213 and 223 correspond to 113 and 123 shown in FIG. 1. The global VDD 207 corresponds to 107 in FIG. 1. The local power supplies 209 and 219 correspond to 109 and 119 shown in FIG. 1.

As the input signal 140 enables a power up process by changing to a logical 0, a PMOS transistor P1 in the first power control circuit 208 has a logical 0 at its gate to turn on P1. An inverter 202 inverts the input signal (logical 0) to a logical 1 that turns off a PMOS transistor P3. Since P1 couples a logical 0 of the local power supply 209 to the gate of a PMOS transistor P2 in the first power control circuit 208, P2 is turned on. Therefore, the PMOS transistor P2 is in a diode mode because P1 effectively short-circuits the gate and drain of P2. P2 has a limited current capacity to avoid excessive peak current and charges up the local power supply 209, e.g., VDDPD1, from the global power supply 207, e.g., global VDD.

The inverter 202's inverted signal 203 (logical 1) also provides a logical 1 to the gates of a PMOS transistor P4 and an NMOS transistor N2 in the sequence circuit 210 to turn off P4 and turn on N2. As VDDPD1 is charged up to a specified voltage, e.g., the threshold voltage of an NMOS transistor N1, N1 is turned on. Because NMOS transistors N1 and N2 are turned on, the gate of a PMOS transistor P5 in the second power control 212 has a logical 0. This is the first control signal 211 provided to the second power control circuit 212 that turns on P5.

Also, the second control signal 213 of the first power domain 101 (as shown in FIG. 1) is also a logical 0 to start a power up process of the power management circuit 105a of the second power domain 102 (as shown in FIG. 1). Since the power management circuit 105a has a similar structure as the power management circuit 104a of the first power domain 101, the same process as described above are repeated for the power up process of the second power domain 102. Further, a second control signal 223 of the second power domain 102 is usable to start a power up process of the power management circuit of the next power domain, e.g., the third power domain 103 (as shown in FIG. 1). In summary, the input signal 140 initiates a serial chain power up process of power domains, e.g., 101, 102, and 103.

For a power down process, as the input signal 140 enables a power down process by changing to a logical 1, the PMOS transistor P1 in the first power control circuit 208 has a logical 1 at its gate to turn off P1. The inverter 202 inverts the input signal (logical 1) to a logical 0 that turns on the PMOS transistor P3. Since P1 couples a logical 1 of the local power supply 209 to the gate of the PMOS transistor P2 in the first power control circuit 208, and turns off the PMOS transistor P2 in the first power control circuit 208. Therefore, the PMOS transistors P1 and P2 in the first power control circuit 208 are turned off and there is no charging up VDDPD1 from the global VDD using the first power control circuit 208. The inverter 202's inverted signal 203 (logical 0) also provides a logical 0 to the gates of the PMOS transistor P4 and an NMOS transistor N2 in the sequence circuit 210 to turn on P4 and turn off N2. Therefore, the first control signal at 211 becomes a logical 1 from Global VDD through P4 that turns off the PMOS transistor P5 in the second power control circuit 212.

Also, the second control signal 213 of the first power domain 101 is a logical 1 to start a power down process of the power management circuit 105a of the second power domain 102. Since the power management circuit 105a has a similar structure as the power management circuit 104a of the first power domain 101, the same process as described above are repeated for the power down process of the second power domain 102. Further, the second control signal 223 of the second power domain 102 also starts a power down process of the power management circuit of the next power domain, e.g., the third power domain 103. In summary, the input signal 140 initiates a serial chain power down process of power domains, e.g., 101, 102, and 103.

Figure 3:
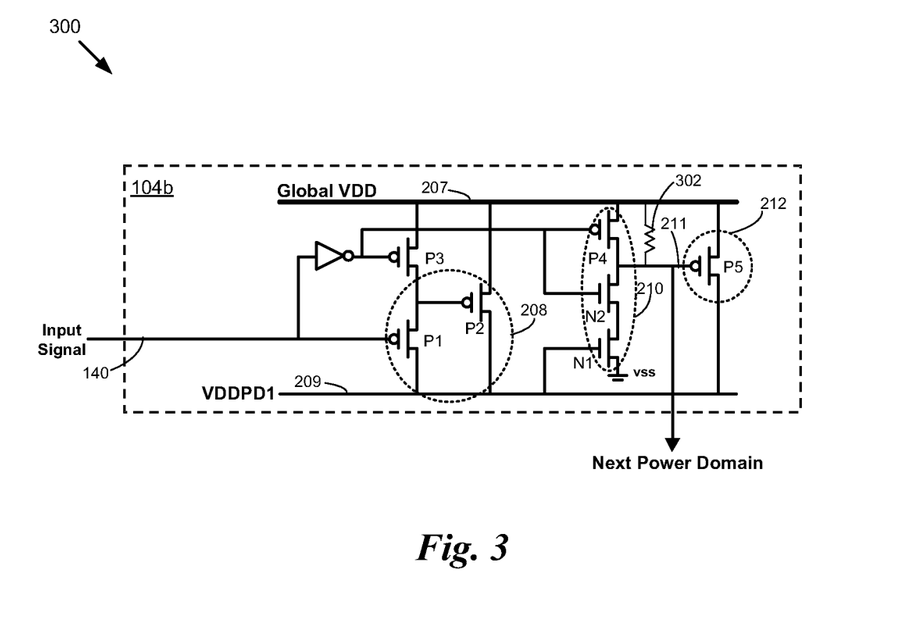
FIG. 3 is a schematic diagram showing another implementation for the power management circuit of FIG. 2 in accordance with some embodiments.

FIG. 3 is a schematic diagram showing another implementation for the power management circuit of FIG. 2 embodiments. FIG. 3 shows a power management circuit 104b for the first power domain 101 (as the power management circuits 104 shown in FIG. 1). The circuit in FIG. 3 is the same as the power management circuit 104a in FIG. 2, except for a resistor 302. A keeper circuit, e.g., the resistor 302 is used for voltage keeping at the gate of P5, when the first power control circuit 208 is enabled until the first control signal 213 turns on P5 in the second power control circuit 212. The resistor 302 has a small current flowing from Global VDD to keep the voltage level 211 at a logical 1 to make it stable, until there is enough current discharge through NMOS transistors N1 and N2 to change the voltage level of the first control signal 211 to a logical 0. The operation of the circuit in FIG. 3 is similar to the circuit in FIG. 2.

Figure 4:
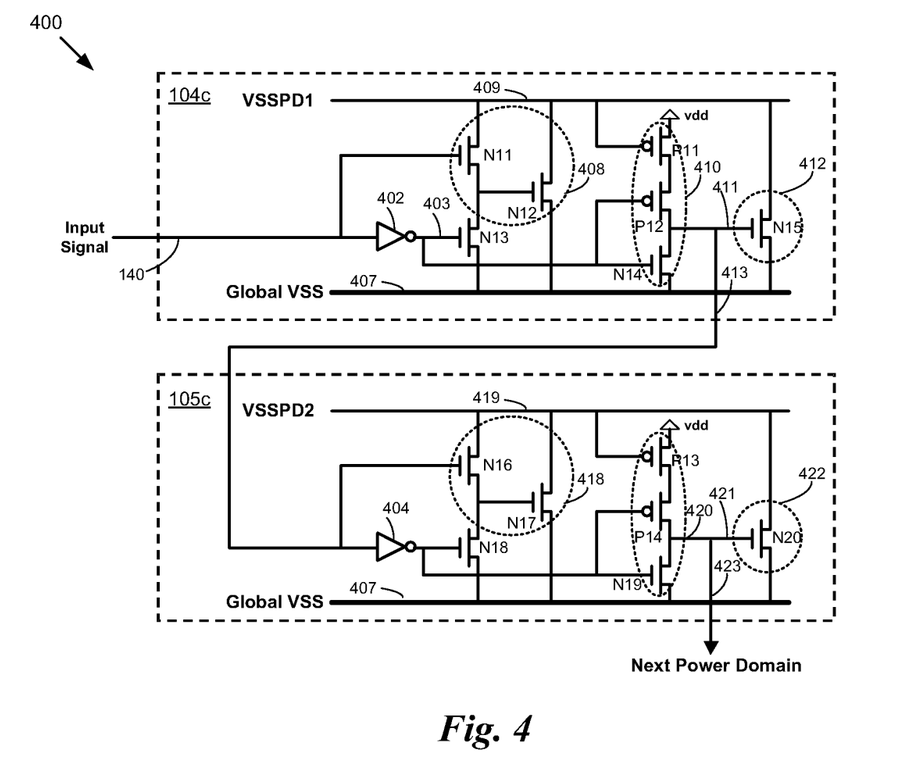
FIG. 4 is a schematic diagram showing another exemplary power management circuit according to FIG. 1 in an integrated circuit with multiple power domains in accordance with some embodiments.

FIG. 4 is a schematic diagram showing another exemplary power management circuit according to FIG. 1 in an integrated circuit with multiple power domains, in accordance with some embodiments. FIG. 4 shows power management circuits 104c for the first power domain 101 (as the power management circuits 104 shown in FIG. 1) and 105c for the second power domain 102 (as the power management circuits 105 shown in FIG. 1). Power management circuits 104c and 105c are implemented as "footer" circuits because they are connected to a low power supply voltage VSS. The first power control circuits 408 and 418 correspond to 108 and 118 shown in FIG. 1. The sequence circuits 410 and 420 correspond to 110 and 120 shown in FIG. 1. The second power control circuits 412 and 422 correspond to 112 and 122 shown in FIG. 1. The first control signals 411 and 421 correspond to 111 and 121 shown in FIG. 1. The second control signals 413 and 423 correspond to 113 and 123 shown in FIG. 1. The global VSS 407 corresponds to 107 in FIG. 1. The local power supplies 409 and 419 correspond to 109 and 119 shown in FIG. 1.

As the input signal 140 enables a power up process by changing to a logical 1, an NMOS transistor N11 in the first power control circuit 408 has a logical 1 at its gate to turn on N11. An inverter 402 inverts the input signal (logical 1) to a logical 0 that turns off an NMOS transistor N13. Since N11 couples a logical 1 of the local power supply 409 to the gate of a NMOS transistor N12 in the first power control circuit 408, this turns on an NMOS transistor N12 in the first power 408. Therefore, the NMOS transistor N12 is in a diode mode because N11 effectively shortcircuits the gate and drain of N12. N12 has a limited current capacity and charges down the local power supply 409, e.g. VSSPD1, from the global power supply 407, e.g., global VSS.

The inverter 402's inverted signal 403 (logical 0) also provides a logical 0 to the gates of an NMOS transistor N14 and a PMOS transistor P12 in the sequence circuit 410 to turn off N14 and turn on P12. As VSSPD1 is charged down to a specified voltage, e.g., the threshold voltage of a PMOS transistor P11, P11 is turned on. Because PMOS transistors P11 and P12 are turned on, the gate of an NMOS transistor N15 in the second power control 412 has a logical 1 (i.e., a first control signal 411 to the second power control circuit 412) to turn on N15. Also, a second control signal 413 of the first power domain 101 is also a logical 1 to start a power up process of the power management circuit 105c of the second power domain 102. Since the power management circuit 105c has a similar structure as the power management circuit 104c of the first power domain 101, the same process as described above are repeated for the power up process of the second power domain 102. Further, a second control signal 423 of the second power domain 102 is also usable to start a power up process of the power management circuit of the next power domain, e.g., the third power domain 103 (as shown in FIG. 1). In summary, the input signal 140 initiates a serial chain power up process of power domains, e.g., 101, 102, and 103.

For a power down process, as the input signal 140 enables a power down process by changing to a logical 0, the NMOS transistor N11 in the first power control circuit 408 has a logical 0 at its gate to turn off N11. The inverter 402 inverts the input signal (logical 0) to a logical 1 that turns on the NMOS transistor N13. Since N11 couples a logical 0 of the local power supply 409 to the gate of the NMOS transistor N12 in the first power control circuit 408, this turns off the NMOS transistor N12 in the first power control circuit 408. Therefore, the NMOS transistors N11 and N12 in the first power control circuit 408 are turned off and there is no charging down VSSPD1 from the global VSS using the first power control circuit 408. The inverter 402's inverted signal 403 (logical 1) also provides a logical 1 to the gates of the NMOS transistor N14 and a PMOS transistor P12 in the sequence circuit 410 to turn on N14 and turn off P12. Therefore, the first control signal at 411 becomes a logical 0 that turns off the NMOS transistor N15 in the second power control circuit 412.

Also, the second control signal 413 of the first power domain 101 is a logical 0 to start a power down process of the power management circuit 105c of the second power domain 102. Since the power management circuit 105c has a similar structure as the power management circuit 104c of the first power domain 101, the same process as described above are repeated for the power down process of the second power domain 102. Further, the second control signal 423 of the second power domain 102 is also usable to start a power down process of the power management circuit of the next power domain, e.g., the third power domain 103 (as shown in FIG. 1), that has also a similar power management circuit structure as the first power domain 101. In summary, the input signal 140 initiates a serial chain power down process of power domains, e.g., 101, 102, and 103.

Figure 5:
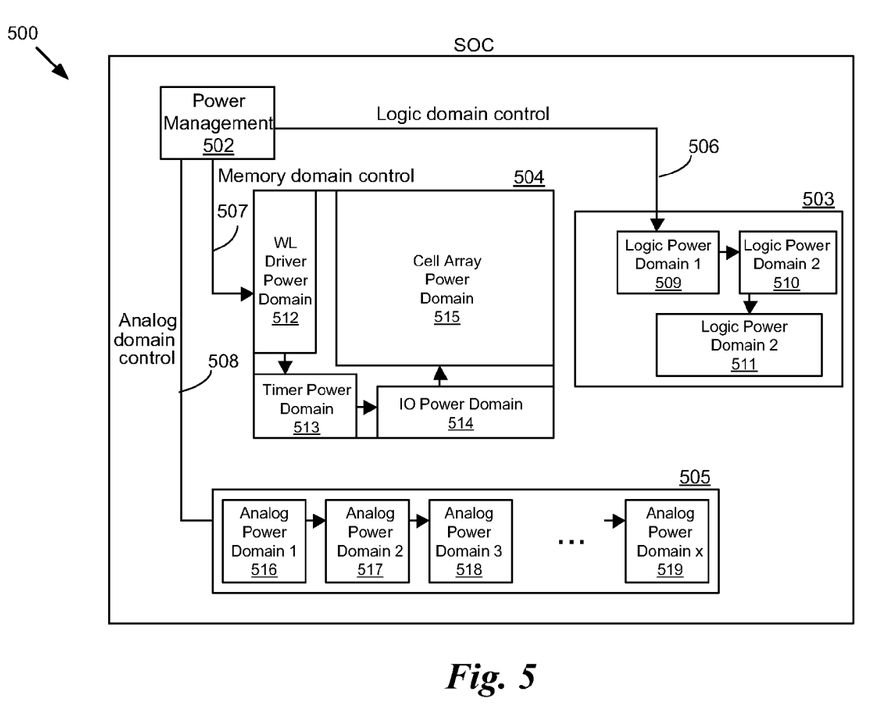
FIG. 5 is a schematic diagram showing an exemplary system on chip (SOC) implementation using the power management scheme of an integrated circuit with multiple power domains according to FIG. 1 in accordance with some embodiments.

FIG. 5 is a schematic diagram showing an exemplary system on chip (SOC) implementation using the power management scheme of an integrated circuit with multiple power domains according to FIG. 1, in accordance with some embodiments. The SOC 500 includes a power management block 502 that controls three sections, e.g., a logic section 503, memory section 504, and analog section 505. Each section is controlled by control signals, e.g., logic domain control 506, memory domain control 507, and analog domain control 508.

When the power management block 502 enables the logic domain control 506 to initiate a power up process, a first logic power domain 509 begins to power up. When the local power supply voltage of the first logic power domain 509 reaches a certain level, this causes a second logic power domain 510 to power up. Similarly, when the local power supply voltage of the second logic power domain 510 reaches a certain level, this causes a third logic power domain 511 to power up. The process progresses as described previously under FIG. 1.

Similarly, the memory domain control 507 can initiate a power up process of the memory block 504. The power up process proceeds along the serial chain, e.g., starting from a word line (WL) driver power domain 512, then a timer power domain 513, to an IO power domain 514, to a cell array power domain 515. Also, the analog domain control 508 can initiate a power up process of the analog block 505, starting from a first analog power domain 516, then a second analog power domain 517, . . . , to an x-th power domain 519 (x is a positive integer).

A power down process of the SOC 500 is also controlled by the power management block 502 using the control signals 506, 507, and 508. The power down process proceeds along the serial chain of power domains in each section, e.g., 503, 504, and 505, similar to the power up process.

Figure 6:
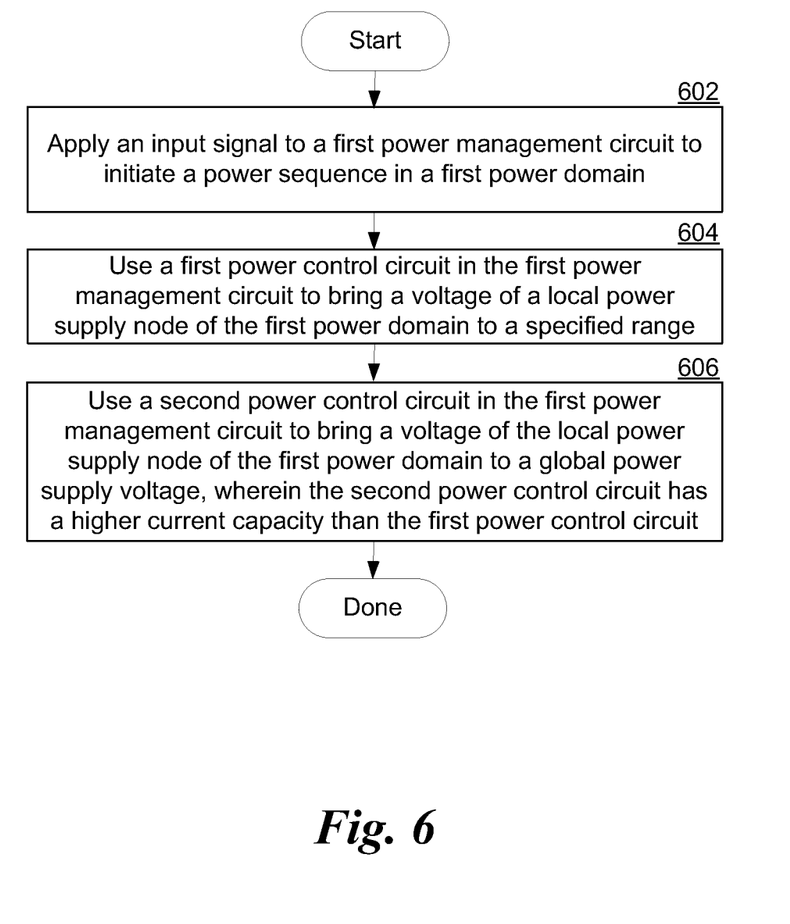
FIG. 6 is a flowchart showing an exemplary method for the power management scheme of FIG. 1 in accordance with some embodiments.

FIG. 6 is a flowchart showing an exemplary method for the power management scheme of FIG. 1 embodiments. At step 602, an input signal is applied to a first power management circuit 104 to initiate a power sequence in a first power domain 101. At step 604, a first power control circuit 108 in the first power management circuit 104 is used to bring a voltage of a local power supply node 109 of the first power domain 101 to a specified range. At step 606, after the voltage of the local power supply node 109 of the first power domain 101 is brought to the specified range, a second power control circuit 112 is used in the first power management circuit 104 to bring a voltage of the local power supply node 109 of the first power domain 101 toward a global power supply voltage 107, wherein the second power control circuit 112 has a higher current capacity than the first power control circuit 108. In some embodiments, the local power supply node 109 can be charged to and maintain a voltage level substantially no less than 95% of the global power supply voltage 107.

Further, a first control signal 111 generated by the sequence circuit 110 can be used to initiate a power sequence in the second power control circuit 112. A second control signal 113 can be used to initiate a power sequence in a second power domain 102 after the voltage of the local power supply node 109 of the first power domain 101 reaches a specified range.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

The above method embodiment shows exemplary steps, but they are not necessarily required to be performed in the order shown. Steps may be added, replaced, changed order, and/or eliminated as appropriate, in accordance with the spirit and scope of embodiment of the disclosure.

Each claim of this document constitutes a separate embodiment, and embodiments that combine different claims and/or different embodiments are within scope of the disclosure and will be apparent to those skilled in the art after reviewing this disclosure. Accordingly, the scope of the disclosure should be determined with reference to the following claims, along with the full scope of equivalences to which such claims are entitled.

What is claimed is:

1. A circuit, comprising:
   a global power supply node; and
   a first local power supply node;
   a first power control circuit configured to enable a first current path between the global power supply node and the first local power supply node in response to an input signal;
   a first sequence circuit configured to generate a first control signal in response to a voltage level of the first local power supply node; and
   a second power control circuit configured to enable a second current path between the global power supply node and the first local power supply node in response to the first control signal, and current capacity of the second current path being greater than current capacity of the first current path.

2. The circuit of claim 1, wherein the first power control circuit comprises:
   a first transistor having a gate terminal, a source terminal, and a drain terminal, the source terminal and the drain terminal of the first transistor each coupled to a corresponding one of the global power supply node and the first local power supply node.

3. The circuit of claim 2, wherein the first power control circuit further comprises:
   a second transistor coupled to the gate terminal of the first transistor and configured to cause the first transistor functioning as a diode in response to the input signal.

4. The circuit of claim 1, wherein the second power control circuit comprises:
   a third transistor having a gate terminal, a source terminal, and a drain terminal, the source terminal and the drain terminal of the third transistor each coupled to a corresponding one of the global power supply node and the first local power supply node, and the gate terminal of the third transistor is configured to receive the first control signal.

5. The circuit of claim 1, wherein the first sequence circuit comprises:
   an inverting circuit configured to generate the first control signal in response to the input signal; and a fourth transistor configured to enable the inverting circuit in response to the voltage level of the first local power supply node.

6. The circuit of claim 5, wherein the inverting circuit comprises:
an output node;
a fifth transistor having a gate terminal, a source terminal, and a drain terminal, the source terminal of the fifth transistor coupled to the global power supply node; and
a sixth transistor having a gate terminal, a source terminal, and a drain terminal, the source terminal of the sixth transistor coupled to the fourth transistor, the drain terminal of the sixth transistor coupled to the drain terminal of the fifth transistor at the output node of the inverting circuit, the gate terminal of the six transistor coupled to the gate terminal of the fifth transistor, and the first control signal being generated at the output node of the inverting circuit.

7. The circuit of claim 1, further comprising:
a second local power supply node; and
a third power control circuit configured to enable a third current path between the global power supply node and the second local power supply node in response to the first control signal.

8. The circuit of claim 7, wherein the third power control circuit comprises:
a seventh transistor having a gate terminal, a source terminal, and a drain terminal, the source terminal and the drain terminal of the seventh transistor each coupled to a corresponding one of the global power supply node and the second local power supply node.

9. The circuit of claim 8, wherein the third power control circuit further comprises:
an eighth transistor coupled to the gate terminal of the seventh transistor and configured to cause the seventh transistor functioning as a diode in response to the first control signal.

10. The circuit of claim 7, further comprising:
a second sequence circuit configured to generate a second control signal in response to a voltage level of the second local power supply node; and
a fourth power control circuit configured to enable a fourth current path between the global power supply node and the second local power supply node in response to the second control signal, and current capacity of the fourth current path being greater than current capacity of the third current path.

11. The circuit of claim 10, wherein the fourth power control circuit comprises:
a ninth transistor having a gate terminal, a source terminal, and a drain terminal, the source terminal and the drain terminal of the ninth transistor each coupled to a corresponding one of the global power supply node and the second local power supply node, and the gate terminal of the ninth transistor is configured to receive the second control signal.

12. A circuit, comprising:
a global power supply node; and
a first local power supply node;
a first transistor having a gate terminal, a source terminal, and a drain terminal, the source terminal and the drain terminal of the first transistor each coupled to a corresponding one of the global power supply node and the first local power supply node;
a second transistor having a gate terminal, a source terminal, and a drain terminal, the drain terminal of the second transistor coupled to the first local power supply node, the source terminal of the second transistor coupled to the gate terminal of the first transistor;
a third transistor having a gate terminal, a source terminal, and a drain terminal, the source terminal of the third transistor coupled to the global power supply node, and the drain terminal of the third transistor coupled to the source terminal of the second transistor; and
an inverter having an input and an output, the input of the inverter coupled to the gate terminal of the second transistor, and the output of the inverter coupled to the gate terminal of the third transistor.

13. The circuit of claim 12, wherein the circuit satisfies one of the following two conditions:
(1) the first, second, and third transistors are all P-type transistors; and
(2) the first, second, and third transistors are all N-type transistors.

14. The circuit of claim 12, further comprising:
a fourth transistor having a gate terminal, a source terminal, and a drain terminal, the source terminal of the fourth transistor coupled to the global power supply node, and the gate terminal of the fourth transistor coupled to the gate terminal of the third transistor;
a fifth transistor having a gate terminal, a source terminal, and a drain terminal, the drain terminal of the fifth transistor coupled to the drain terminal of the fourth transistor, and the gate terminal of the fifth transistor coupled to the gate terminal of the third transistor; and
a sixth transistor having a gate terminal, a source terminal, and a drain terminal, the drain terminal of the sixth transistor coupled to the source terminal of the fifth transistor, and the gate terminal of the sixth transistor coupled to the first local power supply node.

15. The circuit of claim 14, further comprising:
a seventh transistor having a gate terminal, a source terminal, and a drain terminal, the source terminal and the drain terminal of the seventh transistor each coupled to a corresponding one of the global power supply node and the first local power supply node, and the gate terminal of the seventh transistor coupled to the drain terminals of the fourth and fifth transistors.

16. The circuit of claim 14, further comprising:
a second local power supply node;
an eighth transistor having a source terminal and a drain terminal each coupled to a corresponding one of the global power supply node and the second local power supply node, the eighth transistor being configured to be turned on or off in response to a control signal at the drain terminals of the fourth and fifth transistors.

17. The circuit of claim 14, wherein the circuit satisfies one of the following two conditions:
(1) the fourth transistor being a P-type transistor, and the fifth and the sixth transistors are N-type transistors; and
(2) the fourth transistor is an N-type transistor, and the fifth and the sixth transistors are P-type transistors.

18. A method, comprising:
causing a first transistor functioning as a diode in response to an input signal, the first transistor having a source terminal and a drain terminal each coupled to a corresponding one of a global power supply node and a first local power supply node;
generating a first control signal in response to the input signal and a voltage level at the first local power supply node; and
turning on a second transistor in response to the first control signal, the second transistor having a source terminal and a drain terminal each coupled to a corresponding one of the global power supply node and the first local power supply node.

19. The method of claim 18, further comprising:

causing a third transistor functioning as a diode in response to the first control signal, the third transistor having a source terminal and a drain terminal each coupled to a corresponding one of the global power supply node and a second local power supply node.

20. The method of claim 18, further comprising:

generating a second control signal in response to the first control signal and a voltage level at the second local power supply node; and turning on a fourth transistor in response to the second control signal, the fourth transistor having a source terminal and a drain terminal each coupled to a corresponding one of the global power supply node and the second local power supply node.

* * * * *